(12) United States Patent
Augoustidis et al.

(10) Patent No.: US 10,094,516 B2
(45) Date of Patent: Oct. 9, 2018

(54) LED LIGHT ARRANGEMENT WITH FLEXIBLE CIRCUIT BOARD HAVING GRAPHITE SUBSTRATE

(71) Applicant: NeoGraf Solutions, LLC, Lakewood, OH (US)

(72) Inventors: Alexander J. Augoustidis, Avon Lake, OH (US); Gregory P. Kramer, Lyndhurst, OH (US); Robert Anderson Reynolds, III, Bay Village, OH (US)

(73) Assignee: NeoGraf Solutions, LLC., Lakewood, OH (US)

( * ) Notice: Subject to any disclaimer, the term of this patent is extended or adjusted under 35 U.S.C. 154(b) by 418 days.

(21) Appl. No.: 14/809,194

(22) Filed: Jul. 25, 2015

(65) Prior Publication Data

US 2016/0025280 A1 Jan. 28, 2016

Related U.S. Application Data

(60) Provisional application No. 62/029,073, filed on Jul. 25, 2014.

(51) Int. Cl.
*F21K 99/00* (2016.01)
*H05K 1/03* (2006.01)
(Continued)

(52) U.S. Cl.
CPC ............... *F21K 9/20* (2016.08); *F21V 29/70* (2015.01); *F21V 29/83* (2015.01); *F21V 29/85* (2015.01); *H05B 33/06* (2013.01); *H05B 33/12* (2013.01); *H05K 1/0203* (2013.01); *H05K 1/032* (2013.01); *H05K 1/056* (2013.01); *H05K 3/44* (2013.01); *H05K 7/20127* (2013.01); *H05K 7/20963* (2013.01); *H05K 1/0207* (2013.01); *H05K 1/0209* (2013.01); *H05K 1/036* (2013.01); *H05K 1/0393* (2013.01); *H05K 1/092* (2013.01); *H05K 3/245* (2013.01); *H05K 2201/0195* (2013.01); *H05K 2201/0323* (2013.01); *H05K 2201/0326* (2013.01); *H05K 2201/0338* (2013.01); *H05K 2201/1056* (2013.01); *H05K 2201/10106* (2013.01); *H05K 2201/10128* (2013.01);
(Continued)

(58) Field of Classification Search
CPC ........... F21K 9/30; F21K 29/83; H05K 1/032; H05K 1/092
See application file for complete search history.

(56) References Cited

U.S. PATENT DOCUMENTS 3,404,061 A 10/1968 Bochman et al.
6,020,048 A 2/2000 Oka et al.
(Continued)

OTHER PUBLICATIONS

The International Preliminary Report on Patentability of PCT/US15/42147 dated Feb. 9, 2017.

*Primary Examiner* — Joseph L Williams (57) ABSTRACT

An LED light arrangement is provided. The light arrangement includes LED light emitting components mounted to a flexible circuit board having a flexible graphite substrate. The flexible circuit board includes a dielectric layer formed on the surface of the flexible graphite substrate and an electrically conductive layer formed on the surface of the dielectric. The high in-plane thermal conductivity graphite substrate provides enhanced heat transfer capability to effectively move of heat away from the electronic components for improved cooling of the heat generating light emitting component and surrounding devices.

24 Claims, 10 Drawing Sheets

(51) Int. Cl.
    *H05K 1/09*     (2006.01)
    *F21V 29/83*     (2015.01)
    *F21K 9/20*     (2016.01)
    *F21V 29/70*     (2015.01)
    *F21V 29/85*     (2015.01)
    *H05B 33/06*     (2006.01)
    *H05B 33/12*     (2006.01)
    *H05K 1/05*     (2006.01)
    *H05K 3/44*     (2006.01)
    *H05K 7/20*     (2006.01)
    *H05K 1/02*     (2006.01)
    *H05K 3/24*     (2006.01)

(52) U.S. Cl.
    CPC .............. *H05K 2201/10166* (2013.01); *H05K 2201/10628* (2013.01)

(56) References Cited

U.S. PATENT DOCUMENTS

| | | |
|---|---|---|
| 7,889,502 B1 | 2/2011 | Reis et al. |
| 9,546,763 B2 | 1/2017 | Augoustidis et al. |
| 9,546,764 B2 | 1/2017 | Augoustidis et al. |
| 2003/0067733 A1 | 4/2003 | Mecuri |
| 2005/0111189 A1 | 5/2005 | Smalc |
| 2006/0099406 A1 | 5/2006 | Norley et al. |
| 2007/0103875 A1 | 5/2007 | Reis |
| 2009/0032292 A1 | 2/2009 | Park |
| 2010/0142154 A1 | 6/2010 | Collet |
| 2010/0157612 A1 | 6/2010 | Hirose |
| 2012/0121880 A1 | 5/2012 | Ohta |
| 2014/0146477 A1 | 5/2014 | Youn |
| 2014/0190727 A1 | 7/2014 | Lee |
| 2015/0104661 A1 | 4/2015 | Wu |
| 2015/0252956 A1 | 9/2015 | Carroll et al. |

LED LIGHT ARRANGEMENT WITH FLEXIBLE CIRCUIT BOARD HAVING GRAPHITE SUBSTRATE

CROSS REFERENCE TO RELATED APPLICATIONS

This application claims the benefit of U.S. Provisional Application No. 62/029,073 filed Jul. 25, 2014.

TECHNICAL FIELD

The present invention relates to a circuit board having a flexible graphite substrate with examples including flexible circuit board arrangements having a flexible graphite substrate with a dielectric layer and at electrically conductive layer and one or more electronic components mounted to the flexible graphite substrate to form an electrical circuit arrangement. The circuit arrangement can include LED light arrangements for a display device.

BACKGROUND

With the development of more and more sophisticated electronic components, relatively extreme temperatures can be generated. This is clearly true with respect to electronic components capable of increasing processing speeds and higher frequencies, having smaller size and higher power density requirements, those generating new lighting advancements or exhibiting other technological advances. These components include microprocessors a id integrated circuits in electronic and electrical devices and systems as well as in other devices such as high power optical devices. However, microprocessors, integrated circuits and other sophisticated electronic components typically operate efficiently only under a certain range of threshold temperatures. The excessive heat generated during operation of these components can not only harm their own performance, but can also degrade the performance and reliability of the overall system and can even cause system failure. The increasingly wide range of environmental conditions, including temperature extremes, in which electronic systems are expected to operate, exacerbates these negative effects.

With the increased need for heat dissipation from electronic devices caused by these conditions, thermal management becomes an increasingly important element of the design of electronic products. As noted, both performance reliability and life expectancy of electronic equipment are inversely related to the component temperature of the equipment. For instance, a reduction in the operating temperature of a device such as a typical silicon semiconductor can correspond to an exponential increase in the reliability and life expectancy of the device. Therefore, to maximize the life-span and reliability of a component, controlling the device operating temperature within the limits set by the designers is of paramount importance.

Electronic components are typically mounted to a circuit board, also known as a printed circuit board (PCB). The PCB has electrically conductive elements arranged to form an electrical circuit. With traditional PCBs, such as FR4 PCBs, and metal core printed circuit boards ("MCPCB"), the electrically conductive elements are arranged on a substrate. An example of a conventional substrate include fiber reinforced boards, commonly used as FR4 PCBs. Another example of a conventional substrate is a metal base layer, such as for example aluminum, copper, or other known metal which are typically used in MCPCBs and IMSPCBs. Another example of a conventional substrate is ceramics and ceramic compositions.

It is desirable to improve the thermal management of circuit boards to address the needs discussed above.

A liquid crystal display, or LCD, is a display apparatus that utilizes an image display panel formed of two transparent sheets of polarizing material separated by a liquid containing rod-shaped crystals where the polarizing areas of the two sheets are aligned perpendicular to each other. The LCD is constructed to display an image by passing an electric current through the liquid that causes the crystals to align to block light. Each crystal can be controlled individually and acts like a shutter. When the current is applied to specific pixel-like areas, those crystals align to create dark area, or images. The dark areas are combined with light areas to create text and images on the panel. LCD panels do not emit light. Instead, they control how light which is emitted from an external source passes through the LCD and onto the screen to form an image. LEDs are typically used as the light source. The LCDs are back-lit or side-lit by the LEDs depending on the arrangement used.

As manufacturers continually improve the performance of LCD displays, such as by increasing the display's brightness ever-brighter LEDs are being utilized. As a result, the power consumption of the LEDs has increased substantially. LEDs convert at least 70% of their power to heat. The heat generated in the light source is detrimental to the operation and viewing of a liquid crystal display. The light source discharge heat that is transferred to the image display panel, other electrical components in liquid crystal display, and the support structure of the liquid crystal display. Indeed, some of the electrical components in the display panel are themselves heat sources which compounds the problem. However, these other components of the liquid crystal display normally possess poor thermal spreading properties and are not normally designed to dissipate heat front the light source, especially in directions parallel to the image display panel face.

In addition, the illuminating light of a liquid crystal display remains in an energized state and at a consistent power level regardless of the image characteristics on the viewing panel. Variances in the image are control by the arrangement and alignment of the crystals in the image display panel. As such, the components of the liquid crystal display are in need of relief from the constant heat generated by the illuminating light. The constant heat generation can accelerate thermal deterioration of the liquid crystal material from which the display is formed and shorten the useful lifespan of the liquid crystal display device. Heat may also negatively affect the refresh rate of the screen.

Conventional display devices typically utilize a thick, heavy metal support member (often a thick aluminum sheet, or set of multiple sheets) to which is attached both the display panel unit, the light source (which, in the case of LEDs, may be mounted to printed circuit boards, such as a metal core printed circuit board (MCPCB) with a thermally conductive dielectric material) and associated electronic components. Heat passing from these heat sources contributes to uneven temperature distributions created on the panel unit itself, which adversely affects the image presented on the display panels as well as display panel reliability.

The conventional support member provides both a mechanical function (i.e., for mounting the panel unit and associated electronics), as well as a thermal function (i.e., to help sink and spread heat generated by the light source(s) and/or the associated electronics). Accordingly, the support member is typically fabricated from a solid sheet of aluminum, on the order of about 2.0 mm thick. It will be recognized that, since most metals are relatively thermally isotropic, the in-plane thermal conductivity is not substantially different from the through-plane thermal conductivity of the material.

LCD device manufacturers are under extreme pressure to reduce the cost and weight of their existing display solutions, while there has simultaneously been a desire to increase the brightness and luminous efficiency of the panel units. This can mean more power being sent to the light sources, which increases the thermal load on the system and requires additional heat dissipation capabilities within the display units. In addition to increasing brightness and luminous efficiency of the displays, display manufacturers are also under increasing pressure to produce larger panel sires, which tends to increase the weight of the frame system (especially the support member) proportionately.

Thus, what is desired is a light weight and cost effective system for display devices which provides enhanced heat transfer capabilities for the light source circuits.

SUMMARY

A light emitting diode (LED) light arrangement is provided. The light arrangement includes a flexible circuit board including a flexible graphite substrate having a first major surface and a second major surface, a dielectric layer disposed on at least one of the first and second major surfaces, and an electrically conductive layer arranged to form an electrical circuit disposed on the dielectric layer, and an LED mounted to the flexible graphite substrate and in electrically conductive contact with the electrically conductive layer thereby forming a component of the electrical circuit.

It is to be understood that both the foregoing general description and the following detailed description provide embodiments of the invention and are intended to provide an overview or structure of understanding of the nature and character of the invention as it is claimed. The accompanying drawings are included to provide a further understanding of the invention and are incorporated in and constitute a part of the specification. The drawings illustrate various embodiments of the invention and together with the description serve to describe the principles and operations of the invention.

DETAILED DESCRIPTION OF EMBODIMENTS

Figure 1:
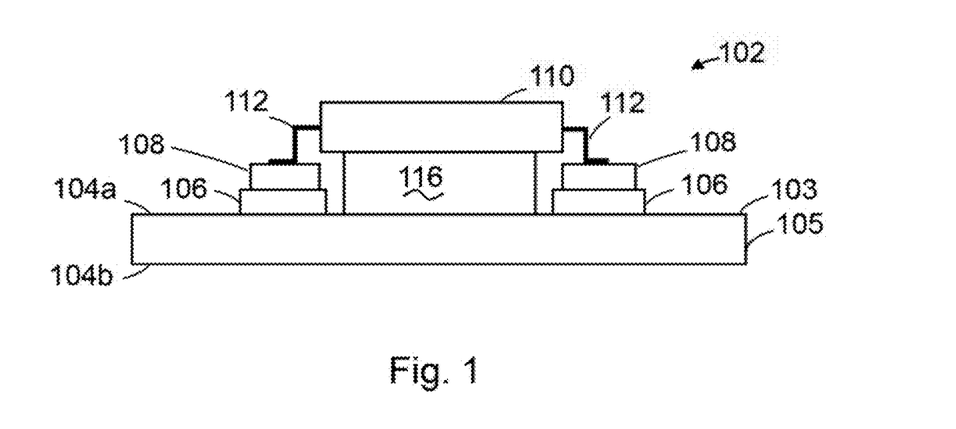
FIG. 1 is a side view of a flexible circuit board as described herein.
Figure 2:
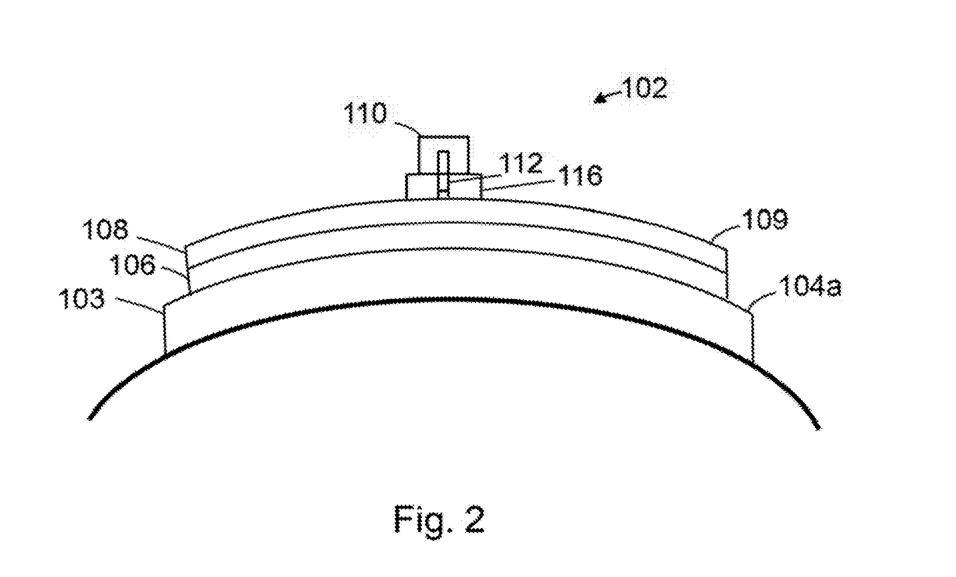
FIG. 2 is a side view of the flexible circuit board of FIG. 1 shown in a curved configuration.

With reference now to FIGS. 1 and 2, an embodiment of a circuit board in accordance with the present invention is shown and generally designated by the reference numeral 102. It should be noted that for the sake of clarity not all the components and elements of the circuit board 102 may be shown and/or marked in all the drawings. Also, as used in this description, the terms "up," "down," "top," "bottom," etc. refer to device 110 when in the orientation shown in FIG. 1. However, the skilled artisan will understand that device 102 can adopt any particular orientation when in use.

As shown in FIG. 1, circuit board 102 includes a substrate 103 formed of a one or more graphite sheets 105, as shall be described in further detail below. The circuit board substrate 103 is formed of graphite, in the form of one or more sheets of compressed particles of expanded graphite, such as for example exfoliated graphite, and/or one or more sheets of graphitized polymer synthetic graphite, both of which are referred to herein as flexible graphite 105. Thus, in at least one example the flexible graphite 105 includes one or more sheets of compressed particles of expanded graphite. In another example the flexible graphite 105 includes one or more sheets of graphitized polymer synthetic graphite. In another example, the flexible graphite includes one or more sheets of compressed particles of expanded graphite and one or more sheets of graphitized polymer synthetic graphite. In another example at least one flexible graphite sheet 105 includes both compressed particles of expanded graphite and graphitized polymer synthetic graphite.

In at least one example, the flexible graphite sheet has a thickness ranging from about 0.001 mm to about 1.0 mm. In another example, the flexible graphite sheet has a thickness ranging from about 0.025 mm to about 0.5 mm. In another example the flexible graphite sheet has a thickness ranging from about 0.120 mm to about 0.250 mm.

In at least one example, the flexible graphite sheet 105 is substantially resin-free, wherein resin-free is defined as being below conventional detection limits. In other examples, the flexible graphite sheet 105 has less than 1% by weight resin.

In at least at least one example, the flexible graphite sheet 105 is not epoxy impregnated.

The flexible graphite sheet 105 can have a relatively small amount of binder, or no binder. In at least one example, the flexible graphite 105 sheet can have less than 10% by weight of binder. In another example the flexible graphite sheet 105 can have less than 5% by weight of binder. In at least one, the flexible graphite sheet 105 can substantially binder-free, wherein hinder-free is defined as being below conventional detection limits.

The flexible graphite substrate 103 can be one or more sheets synthetic graphite 105. The synthetic graphite can be formed of a polymer film selected from polyphenyleneoxadiazoles (POD), polybenzothiazole (PBT), polybenzobisthiazole (PBBT), polybenzooxazole (PBO), polybenzobisoxazole (PBBO), poly(pyromellitimide) (PI), poly(phenyleneisophthalamide) (PPA), poly(phenylenebezoimidazole) (PBI), poly(phenylenebenzobisimidazole) (PPBI), polythiazole (PT), and poly(para-phenylenevinylene) (PPV). The polyphenyleneoxadiazoles include poly-phenylene-1,3,4-oxadiazole and isomers thereof. These polymers are capable of conversion into graphite of good quality when thermally treated in an appropriate manner. Although the polymer for the starting film is stated as selected from POD, PBT, PBBT, PBO, PBBO, PI, PPA, PBI, PPBI, PT and PPV, other polymers which can yield graphite of good quality by thermal treatment may also be used.

As noted above, the thusly-formed sheets 105 of compressed particles of exfoliated graphite and/or synthetic graphite forming the substrate 103 are anisotropic in nature; that is, the thermal conductivity of the sheets is greater in the in-plane, or "a" directions, as opposed to the through-sheet, or "c" direction. In this way, the anisotropic nature of the graphite sheet directs the heat along the planar direction of the thermal solution (i.e., in the "a" direction along the graphite sheet). Such a sheet generally has a thermal conductivity in the in-plane direction of at least about 140, more preferably at least about 200, and most preferably at least about 250 W/m° K and in the through-plane direction of no greater than about 12, more preferably no greater than about 10, and most preferably no greater than about 6 W/m° K. Thus, the heat dispersion material forming the substrate 103 has a thermal anisotropic ratio (that is, the ratio of in-plane thermal conductivity to through-plane thermal conductivity) of no less than about 10.

The flexible graphite sheet 105 has flexibility characteristics as determined by its bend radius. The bend radius can be measured by wrapping the sheet 105 360° around a cylindrical mandrel of a predetermined radius. The flexible graphite sheet 105 achieves the bend radius without negatively affecting the structural integrity of the sheet or effecting the function of the electrical circuit. In this respect, "bend radius" as used herein, can also be referred to as the "useful bend radius". The bend radius is smaller than or equal to a threshold bend radius. The bend radius of the sheet 105 can be equal or smaller than the bend radius (described below) achievable by the entire flexible circuit 102 which is formed of the flexible graphite sheet.

The flexible graphite sheet 105 has a bend radius of less than about 600 mm, more preferably less than about 150 mm, more preferably less than about 75 mm, more preferably less than about 25 mm, more preferably less than about 18 mm, and more preferably less than about 12 mm, and more preferably less than about 8 mm. In at least one example, 0.5 mm thick sheet 105 has a bend radius of about 6.0 mm. In at least one other example, 0.25 mm thick sheet 105 has a bend radius of about 3.0 mm.

The substrate 103 of the circuit board 102 shown in FIGS. 1 and 2 is formed of a single sheet of flexible graphite 105, though it should be appreciated that the substrate can be formed of a plurality of flexible graphite sheets as discussed in further detail below. In at least example, the substrate 103 has a thickness ranging from about 0.001 mm to about 1.0 mm. In another example, the substrate 103 has a thickness ranging from about 0.025 mm to about 0.5 mm. In another example the substrate 103 has a thickness ranging from about 0.120 mm to about 0.250 mm.

The substrate 130 has flexibility characteristics that are at least as flexible as the flexible circuit board 102, as described below, that is to say, it has a bend radius that is equal to or smaller than the flexible circuit board enabling the substrate to be bent or otherwise distorted from a planar configuration in a manner while maintaining its properties suitable for use as a circuit board as described herein.

Referring again to FIGS. 1 and 2, the circuit board substrate 103 has oppositely disposed major surfaces 104a, 104b. A dielectric layer 106 is disposed on at least one of the surfaces 104a, 104b. In at least one example, the dielectric layer 106 is disposed directly on the at least one of surfaces 104a, 104b. In another example, one or more thin coatings or films can be applied directly on the at least one of the surfaces 104a, 104b and the dielectric layer 106 is disposed directly the one or more thin coatings. Examples of these thin coatings or films can include a thin conductive foil or sputtered coating, such as for example a sputtered conductive coating. It is desirable that any such coating or film disposed directly on the surface of the substrate would not provide a significant thermal barrier and thus would not adversely affect the heat transfer from the dielectric layer 106 (and/or any thermally conductive conduit 116 discussed below) to the substrate 103. Thickness ranges can include 1.0 μm micron to 250 μm, and in other examples the thickness can be about 10 μm to about 100 μm, and still in other examples the thickness can be about 25 μm to about 50 μm. Multiple layers of conductive and insulated inks can be applied to create multiples of single thicknesses, as determined by the desired electrical requirements.

The dielectric layer 106 can be formed of a thick film paste.

An example of a suitable dielectric layer formed of a thick film paste has a preferable breakdown voltage of about 1000 VDC/mil, ranging from about 500 VDC/mil to about 1500 VDC/mil, with other examples ranging from about 800 VDC/mil to about 1200 VDC/mil, with other examples ranging from about 900 VDC/mil to about 1100 VDC/mil.

The thick film dielectric layer 106 can have a thickness which can range from about 5 μm to about 100 μm. In another example, the dielectric thickness can range from about 5 μm to 50 μm, in another example, the dielectric thickness can range from about 5 μm to 20 μm and in another example, the dielectric thickness can range from about 15 to 20 μm.

In at least one example, the dielectric layer 106 can be a polyimide.

The dielectric layer 106 is flexible, and capable of being bent or otherwise distorted from a planar configuration as described in further detail below, as shown in FIG. 2, while maintaining dielectric properties suitable for use in a circuit board. The dielectric layer 106 can be as flexible as the flexible graphite substrate 103 while maintaining dielectric properties suitable for use in a circuit board.

Dielectric layers used in the printed circuit, board industry for conventional less flexible and/or rigid printed circuit boards are unsuitable for use in the flexible circuit board 102 described herein. Thus, the dielectric layer 106 is not a glass fiber formed as a laminate, polytetrafluoroethylene (PTFE), commercially available as Teflon brand materials, and expanded PTFE, sometimes denoted ePTFE, commercially available as Gore-Tex brand materials, as well as resin-impregnated or -imbibed versions of the foregoing.

An electrically conductive layer 108 is applied onto the dielectric layer 106 such that the dielectric layer is disposed between the electrically conductive layer 108 and the graphite sheet substrate 103. In at least one example, the electrically conductive layer 108 can be formed directly on the surface of the dielectric layer 106. The electrically conductive layer 108 is configured to form an electrical circuit 109.

The electrically conductive layer 108 can include at least one of silver, copper, aluminum. In another example, the electrically conductive layer 108 can include a conductor paste, such as for example copper conductor paste, silver conductor paste or aluminum conductor paste. The conductor paste can be as thick film conductor paste commercially available from Heraeus Materials Technology LLC. In another example, the electrically conductive layer 108 can include a metal foil.

The thick film electrically conductive layer 108 can have a thickness which can range from about 5 to about 100 µm. In another example, the electrically conductive layer thickness can range from about 5 to 50 µm, in another example, the electrically conductive layer thickness can range from about 5 to 20 µm and in another example, the electrically conductive layer thickness can range from about 15 to 20 µm.

The electrically conductive layer 108 can be flexible, capable of being bent or otherwise distorted from a planar configuration as described in further detail below, as shown in FIG. 2, while maintaining electrically conductive properties suitable for functioning as an electrical circuit on a circuit board 102. The electrically conductive layer 108 can be as flexible as the flexible graphite substrate 103, while maintaining electrically conductive properties suitable for functioning as an electrical circuit on a circuit board 102.

The electrically conductive layer 108 can be applied to the dielectric layer 106 using suitable printing techniques, such as for example screen printing or 3D printing.

In at least one example, the flexible circuit board 102 has a thickness ranging from about 1.0 µm to about 1.1 mm, and more preferably from about 0.100 mm to about 0.800 mm, and more preferably from about 0.200 mm to about 0.650 mm.

Thus formed as described above, the flexible circuit board 102 including, the flexible graphite substrate 103, dielectric layer(s) 106 and conductive layer(s) 108 has similar flexural characteristics as the flexible graphite sheet 105

The flexible circuit board 102 has flexibility characteristics which enable it to be bent, flexed or otherwise distorted from a planar configuration without negatively affecting its performance as a circuit board, thereby maintaining suitable integrity of the board and suitable electrical performance of the circuit 109.

The flexible circuit board 102 has flexibility characteristics as determined by its bend radius. The bend radius can be measured by wrapping the board 102 360° around a cylindrical mandrel of a predetermined radius, as described above. The flexible circuit board 102 achieves the bend radius without negatively affecting the structural integrity of the substrate 103 or effecting the function of the electrical circuit.

The flexible circuit board 102 has a bend radius of less than about 600 mm, more preferably less than about 150 mm, more preferably less than about 75 mm, more preferably less than about 25 mm, more preferably less than about 18 mm, and more preferably less than about 12 mm, and more preferably less than about 8 mm. In at least one non-limiting example, 0.5 mm thick circuit board 102 has a bend radius of about 6.0 mm. In at least one other non-limiting example, a 0.25 mm thick circuit board 102 has a bend radius of about 3.0 mm. In one other non-limiting example the flexible circuit board 102 has a thickness of about 0.300 mm, and a bend radius of 2 cm. In another non-limiting example, the flexible circuit board 102 has a thickness of about 0.650 mm and a bend radius of about 5 cm.

One or more electrical or electronic components 110 are attached to the electrically conductive layer 108 of the circuit board 102 to form an electronic circuit. The electronic component 110 can include one or more electrically conductive feet 112 which are bonded to the electrically conductive layer 108 in a manner which forms an electrically conductive path therebetween.

In at least one example, the screen printed electrically conductive layer thick film 108 is arranged in a predetermined electrical circuit 109. The one or more electrical components 110 are then mounted to the flexible graphite substrate 103 of the circuit board 102 by placing them in physical contact with the electrically conductive layer 108 and the electrically conductive layer is cured to bond the one or more electrical components in electrically conductive contact to the electrically conductive layer thereby firming an forming components of the electrical circuit. The curing process cart include heating the circuit board 102 in a heat cycle.

In another example, one or more of the electrical components 110 can be soldered to the electrically conductive layer 108.

The electronic component 110 can comprise any electronic device or electrical device that produces an amount of heat that is desired to be dissipated away from component 110. In one non-limiting example, the heat generated from component 1101 is dissipated to prevent it from interfering with the operation of the electronic component or the system of which the electronic component is an element. The electronic component 110 can be a surface mount component, or a wire bond component suitable for mounting to the circuit board 102. Other examples of the electronic component 110 can include a microprocessor or computer chip, an integrated circuit, a hybrid integrated circuit, a power transistor including but not limited to a power transistor, a resistor, control electronics such as for example for an optical device like a laser, a field-effect transistor (FET), a printed circuit board (PCB) circuit, or components thereof, or other electronic/electrical element. In at least one example, the electronic component 110 can be one or more LEDs, OLEDs, or combinations thereof.

The graphite substrate 103 of the flexible circuit board 102 provides effective cooling of the LEDs. It has been found that compared to an aluminum light engine arrangement of similar thickness and construction, a flexible graphite substrate used as an LED circuit board has demonstrated a 9.8° C. junction temperature reduction of an LED at 4 W of electrical power.

The electronic component 110 becomes a heat source during operation. It includes at least one surface from which heat radiates and this surface can be used as a source of heat to be dissipated from the electronic component. The flexible graphite substrate. 103 facilitates this dissipation of heat. An optional thermally conductive conduit 116 can be disposed in physical and thermal contact with the surface of the electronic component 110 and with the graphite substrate 103 to conduct heat away from the electronic component 110 and towards/into the graphite substrate where it is then moved away from the component.

Examples of the thermally conductive conduit 116 can include a material similar to the material used in the conductive layer, such as for example thick film conductive paste including but not limited to a silver paste. The thermally conductive conduit 116 also include a thermal grease or other thermally conductive materials. In another example, the thermally conductive conduit 116 can also be one or more layers of flexible exfoliated graphite. In another example, the dielectric can be used as the thermally conductive conduit 116.

Figure 3:
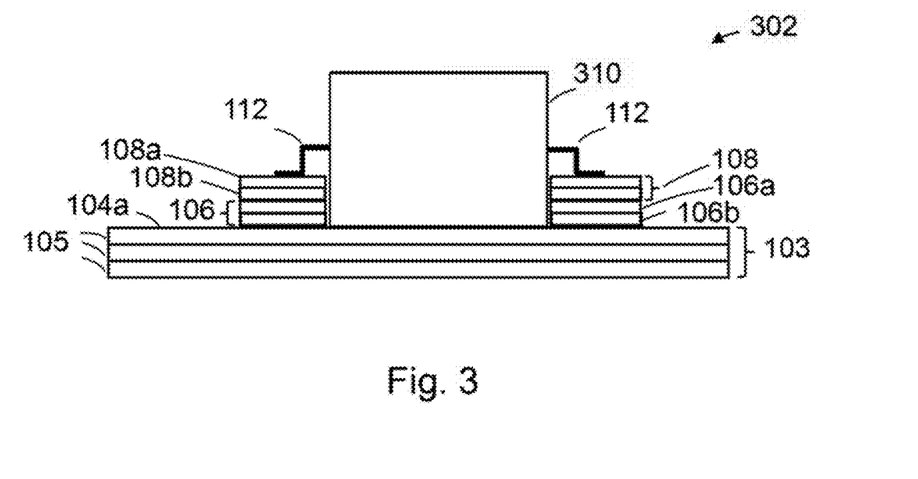
FIG. 3 is a side view of another example of a flexible circuit board as described herein.

As shown in FIG. 3, another example of a flexible circuit board is shown generally at 302. The flexible circuit board 302 includes a substrate 103 formed of a plurality of flexible graphite sheets 105 disposed in a stratified, laminated arrangement. In at least one example, the plurality of sheets of flexible graphite 105 are laminated together in direct contact with each other. In another example, the laminated arrangement of graphite sheets 105 forming the substrate 103 has a layer of a different material interposed between at least two of the graphite sheets, such as for example an adhesive. Though the example shown includes three sheets of flexible graphite 105 it should be appreciated that the plurality of graphite sheets can include any suitable number of graphite sheets laminated together.

A dielectric layer 106 is applied to the substrate surface 104a. In this example the dielectric layer 106 includes a plurality of dielectric layers 106a, 106b disposed on top of each other. Though 2 layers 106a, 106b are shown, it should be appreciated that the dielectric layer can include any suitable number of layers disposed on top of and in contact with each other.

An electrically conductive layer 108 is applied onto the dielectric layer 106 such that the dielectric layer is disposed between the electrically conductive layer 108 and the graphite sheet substrate 103. The electrically conductive layer 108 can be formed directly on the surface of the dielectric layer 106. In this example, the electrically conductive layer 108 includes a plurality of electrically conductive layer 108a, 108b disposed on top of each other. Though 2 layers 108a, 108b are shown, it should be appreciated that the electrically conductive layer 108 can include any suitable number of layers disposed on top of and in contact with each other.

A surface of the body of the electronic component 310 is disposed in physical and thermal contact with the graphite substrate 103 to conduct heat away from the electronic component 310 and towards/into the graphite substrate 103 obviating the use of the thermally conductive conduit 116.

Figure 4:
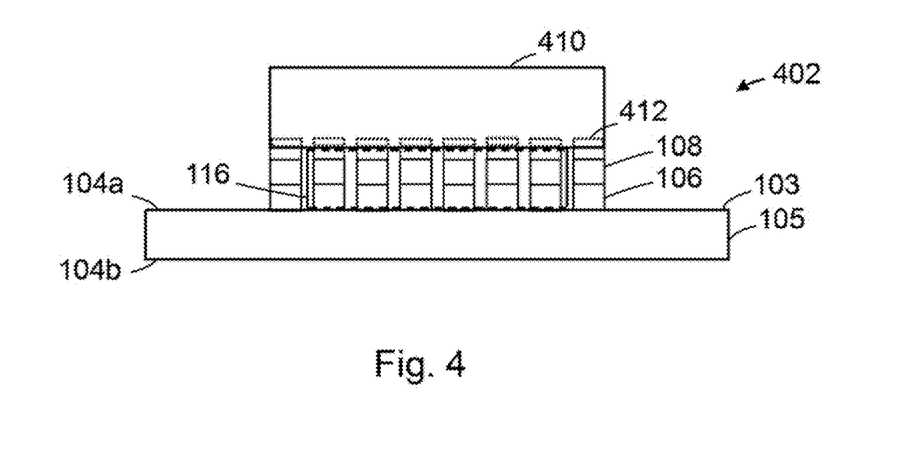
FIG. 4 is a side view of another example of a flexible circuit board as described herein.

Referring now to FIG. 4, another example of a flexible circuit board is shown generally at 402. A surface mount electronic component 410 is attached to the flexible circuit board by bonding one or more electrically conductive mounting pads 412 to the electrically conductive layer 108. A plurality of separate circuit traces, each including a dielectric layer 106 and conductive layer, can be connected to the component 410 in this manner. A thermally conductive conduit 116 is shown in physical and thermal contact with both the electrical component 410 and flexible substrate 103 for conducting heat from the component to the substrate as described above.

Figure 5:
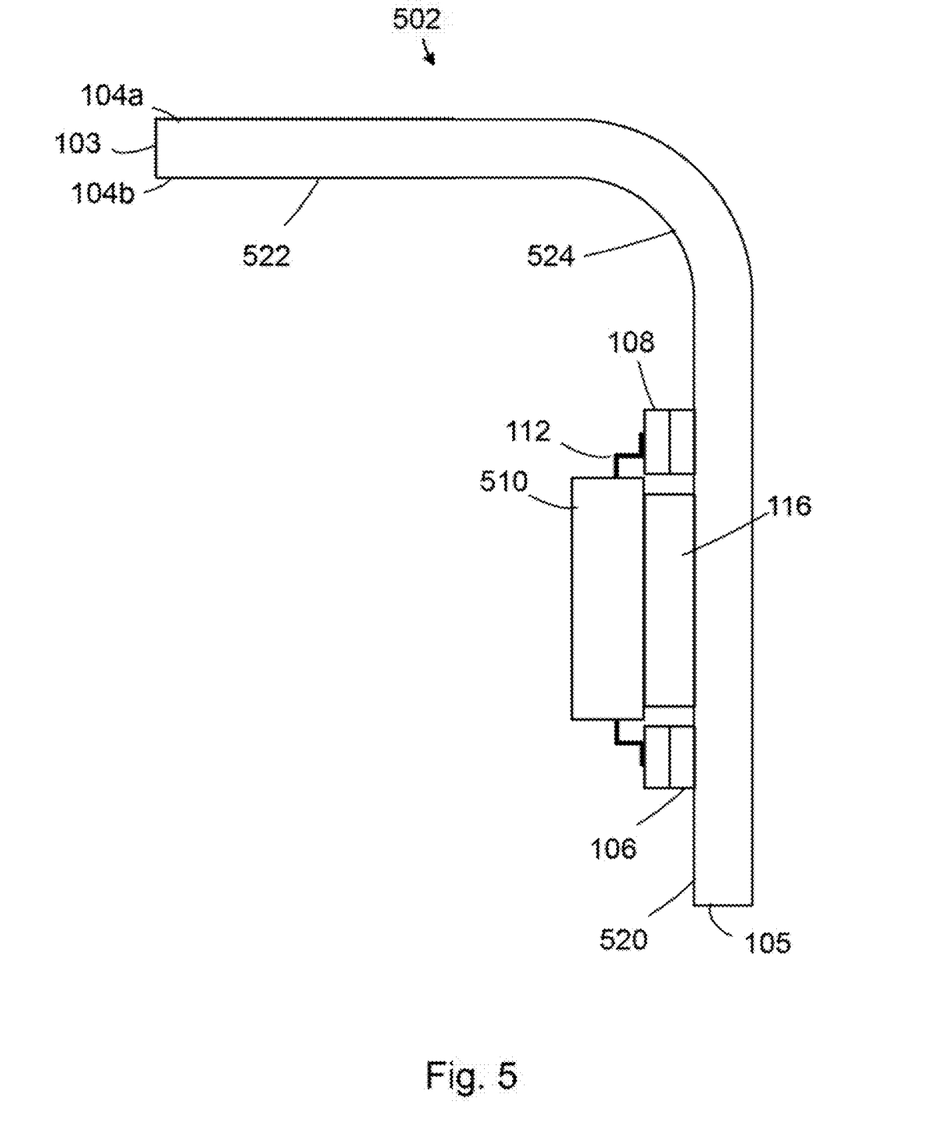
FIG. 5 side view of another example of a flexible circuit board in accordance with invention.

Referring now to FIG. 5, another embodiment of the flexible circuit board is shown generally at 502. The flexible circuit board 502 includes a continuous flexible graphite sheet 105 forming the substrate 103. The substrate 103 includes component section 520, a heat dissipation section 522 and a curved portion 524 disposed between the component section and the heat dissipation section.

A dielectric layer 106 and electrically conductive layer 108 are formed on the component section 520 in a manner as described above. One or more electrical or electronic components 510 are attached electrically conductive layer 108 on the component section 520 to form an electronic circuit. In at least one example, the dielectric layer 106 and electrically conductive layer 108 are not formed on the heat dissipation section 577 or the curved portion 524.

The flexible characteristics of the circuit board substrate 103 enable the heat dissipation section 522 to extend along a different orientation than the component section. In the example provided, the component section 520 and the heat dissipation section 522 each generally planer, extending alone different planes which are approximately perpendicular to each other. However, it should be appreciated that other orientations are contemplated, such as for example one or both of the component section 520 and the heat dissipation section 522 can be curved or otherwise non-planer and/or the sections can extend at different angles relative to each other.

The heat dissipation section 522 can have a similar sized area as the component section 520. In other examples the heat dissipation section 522 can define an area that is smaller than the heat dissipation section. In still other examples, heat dissipation section 522 can define an area that larger than the component section 520, such as about twice the area of the component section, or 3 time the area of the component section, or more than 3 times larger than the area of the component section. The heat dissipation section 522 provides effective removal of heat from the substrate 103 when exposed to moving air, such as in the manner described in further detail below.

Figure 6:
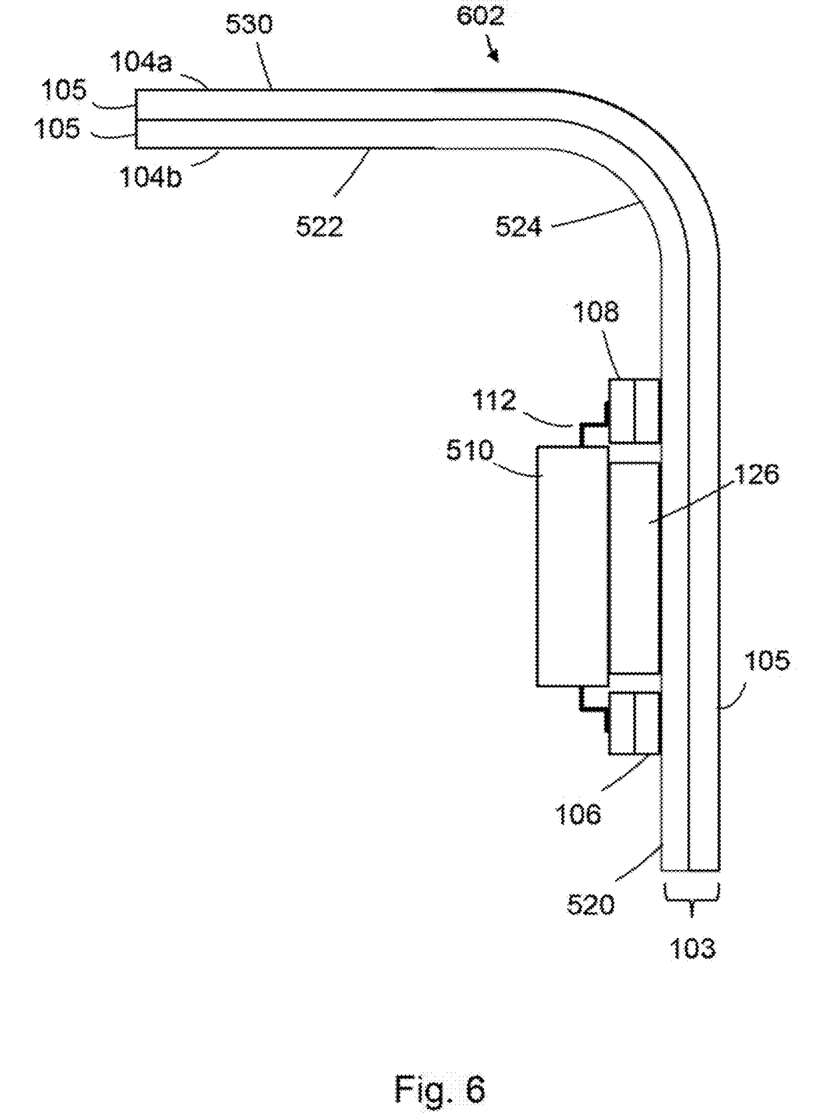
FIG. 6 is a side view of another example of a flexible circuit board as described herein.

Referring now to FIG. 6, another embodiment of the flexible circuit board is shown generally at 602 which is similar to the flexible circuit board 502 describe above. The flexible circuit board 602 includes a substrate 103 formed of a plurality of flexible graphite sheets 105 in a manner as described above.

Figure 7:
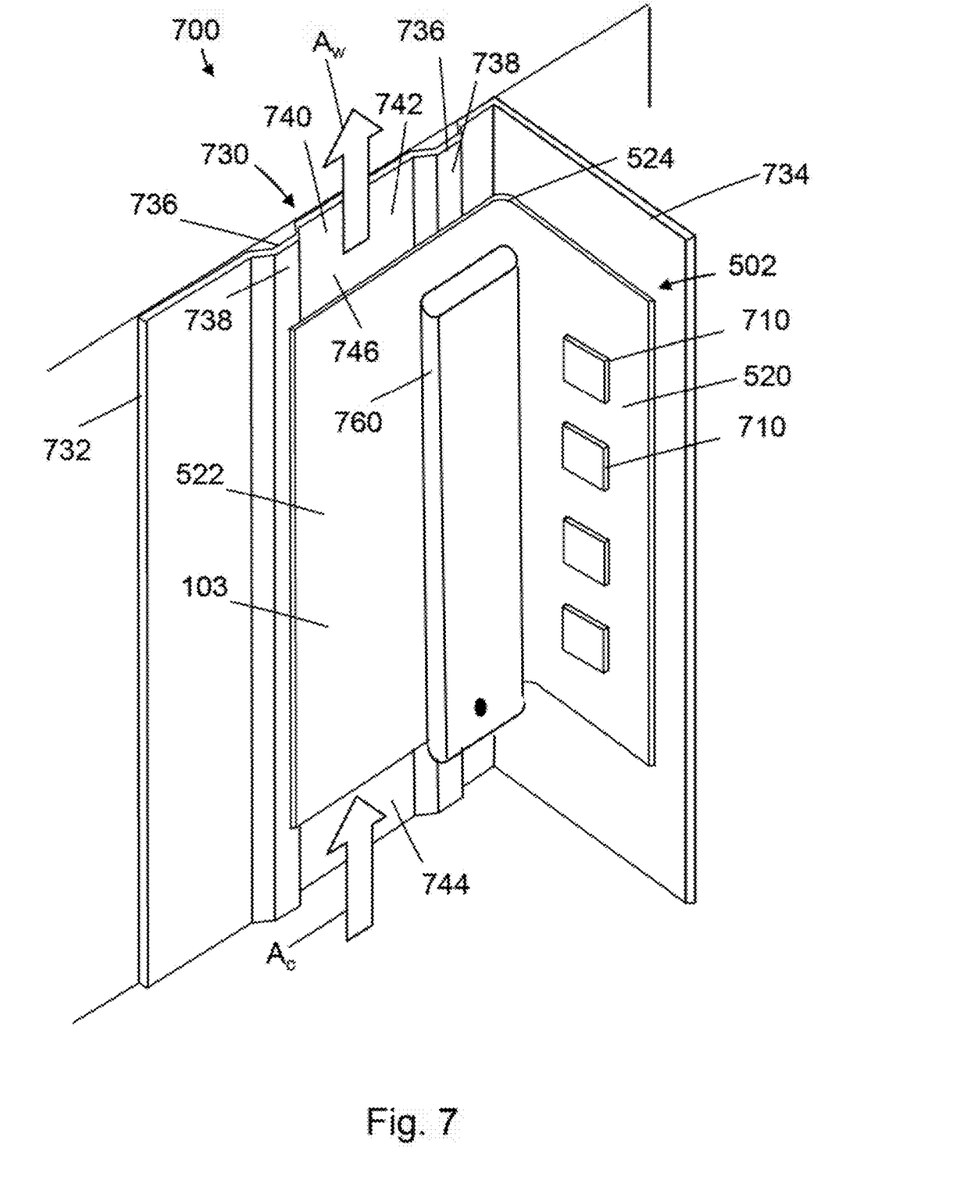
FIG. 7 is a perspective view of the circuit board of FIG. 5 having a rigid frame.
Figure 8:
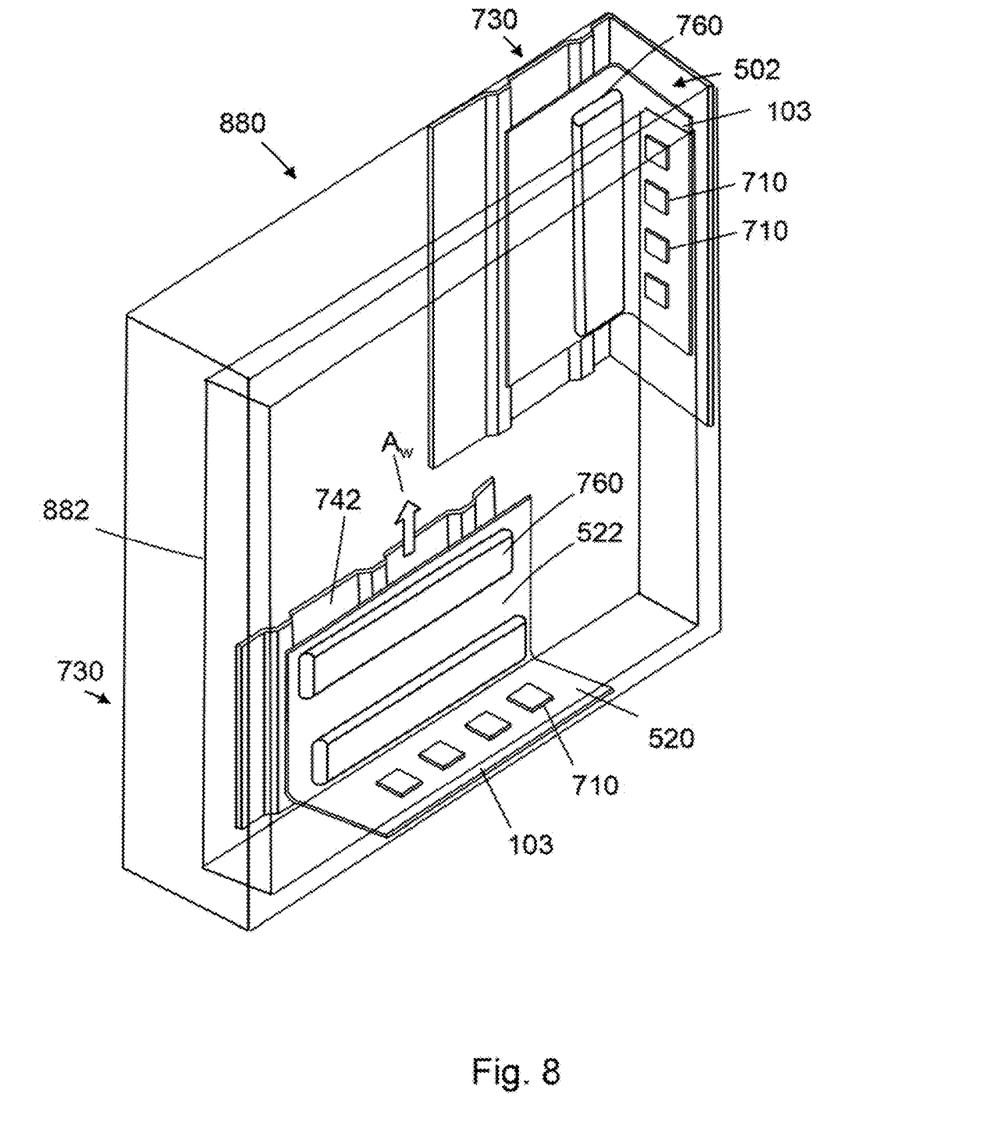
FIG. 8 is a perspective view of the circuit board of FIG. 7 forming a light engine in a display device.

Referring now to FIGS. 7 and 8 an electronic circuit arrangement, also referred to as an LED light engine, for a display device is shown generally at 700. The LED light engine 700 includes the flexible circuit board 502 described above. A plurality of light emitting electrical components 710 are bonded to the electrically conductive layer 108 disposed on the dielectric layer 106 of the component section 520 in a similar manner as at least one of the electrical components 110, 310, 410, 510 described above.

The electrical components 710 are LEDs operatively coupled to an LCD display panel 882 of an image display device 880 as shown generally in FIG. 8. The LCD display panel 882 can be a back-lit LCD panel or a side-lit LCD panel. The example of FIGS. 7 and 8, use side lit LCD display panel 882, wherein the LCD light sources 710 extend in a linear array along the sides, top and bottom edges of the LCD panel so as to emit light towards the edges of the display panel.

Optics, sometimes referred to as light guides, can be employed to even out the light distribution across the rear of the LCD panel so the light does not appear to be originating from or more pronounced at the edges or sides of the panel. In a back-lit LCD panel, rows of the LED light sources 710 can be mounted on a flexible circuit board 110 such that the LEDs sit directly behind the LCD panel to provide direct lighting to the rear of the LCD panel. In addition, whether back-lit or side-lit, LCDs can have a reflective material disposed so as to thither facilitate even light distribution from the light sources to the rear of the LCD panel.

A frame 730 is provided for supporting the flexible circuit board 502. The frame 730 is formed of a plastic, or other rigid material to support the flexible circuit board 502 at a desired orientation. As shown in FIG. 8, the circuit board 502 can be oriented such that the array of LEDs 710 extend vertically to illuminate the vertical edges of the LCD display 882. The circuit board 502 can also be oriented such that the array of LEDs 710 extend horizontally to illuminate the top and bottom edges of the LCD display.

The frame 730 includes a first portion 732 supporting the heat dissipation section 522 and a second portion 734 supporting the component section 520. The first portion 732 forms an angle with respect to the second portion 734 of approximately 90 degree though it should be appreciated that other orientations are contemplated.

The first portion 732 includes a vertically extending support member 736 having a support surface 738. The first portion 732 also includes a vertically extending channel 740 disposed adjacent the support member 736. The flexible circuit board 530 is disposed against the support surface 738 such that the support surface supports the flexible circuit board heat dissipation section 522 in a spaced apart relationship with the channel 740 to form an air duct 742 between the channel and the flexible circuit board heat dissipation section. The air duct 742 includes an inlet 744 for receiving relatively cooler air $A_C$ and an outlet 746 for exhausting relatively warmer air $A_W$ thereby directing air past the heat dissipation section 522 to provide convective cooling of the circuit board 502. The air duct 742 extends generally vertically from the inlet 744 to the outlet 746 to enhance the flow of convective air currents.

The frame 730 can include a plurality of spaced apart support members 736 each having a respective support surface 736 for supporting the circuit board 502 in a spaced apart relationship to one or more channels 740 to form one or more air ducts 742 for moving cooling air past the graphite substrate 103 for cooling the circuit board in this manner.

The flexible circuit board 502 can be secured to the frame 730 using one or more clamp members 760. In the examples provided in FIG. 8, one clamp member 760 is shown in a vertical orientation and two clamp members are shown in a horizontal orientation, though it should be appreciated that more than two can be used. The heat dissipation section 522 is held against the one or more support surfaces 738 using a clamp member 760. The clamp member can extend vertically along the vertically extending support members 736, horizontally in a perpendicular orientation with respect to the support members, or in other suitable orientations. The clamp member 760 is pressed against the surface 104a of the heat dissipation section biasing the opposite surface 104b of the heat dissipation section against the support surface 738. The clamp member 760 can be fastened to the frame 730 using mechanical fasteners such as screws, bolts, rivets, clips, and the like, as known in the art, or adhesives, or using other frame members. Additionally or alternatively, the flexible circuit board 502 can be secured to the frame 730 using fasteners, or adhesives disposed between the frame and the circuit board.

Figure 9:
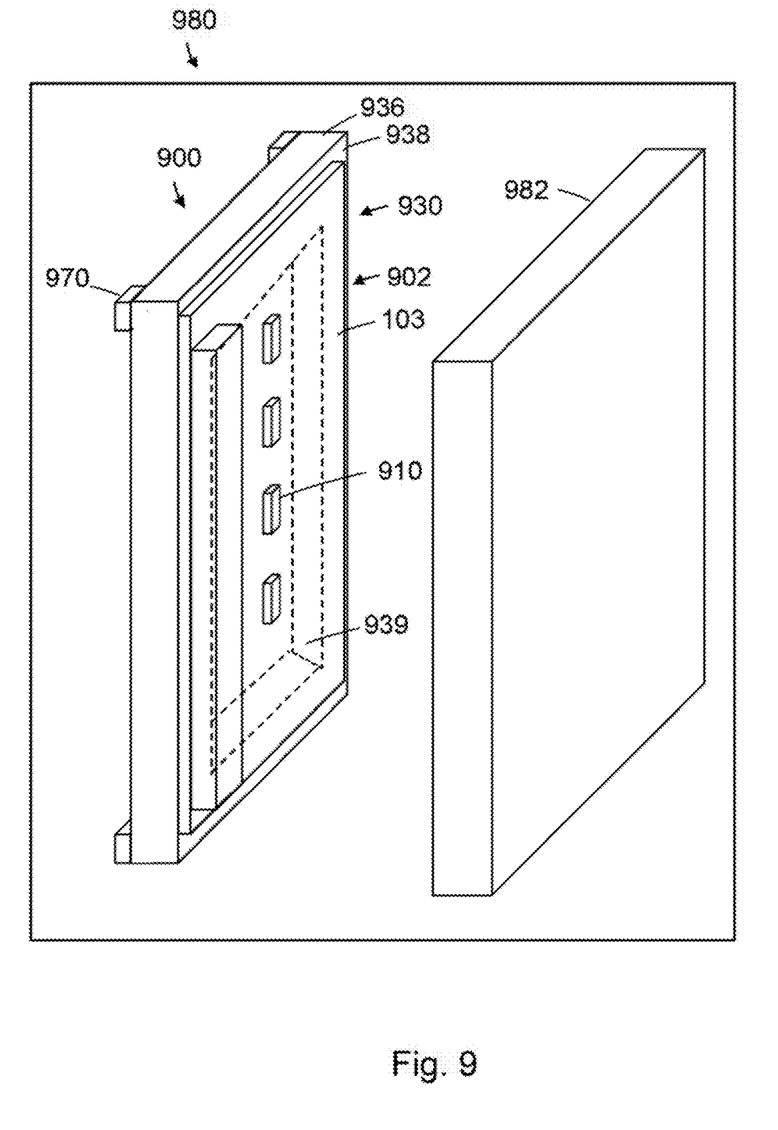
FIG. 9 is a perspective view of the circuit board of FIG. 1 having a rigid frame and forming a light engine in a display device.
Figure 10:
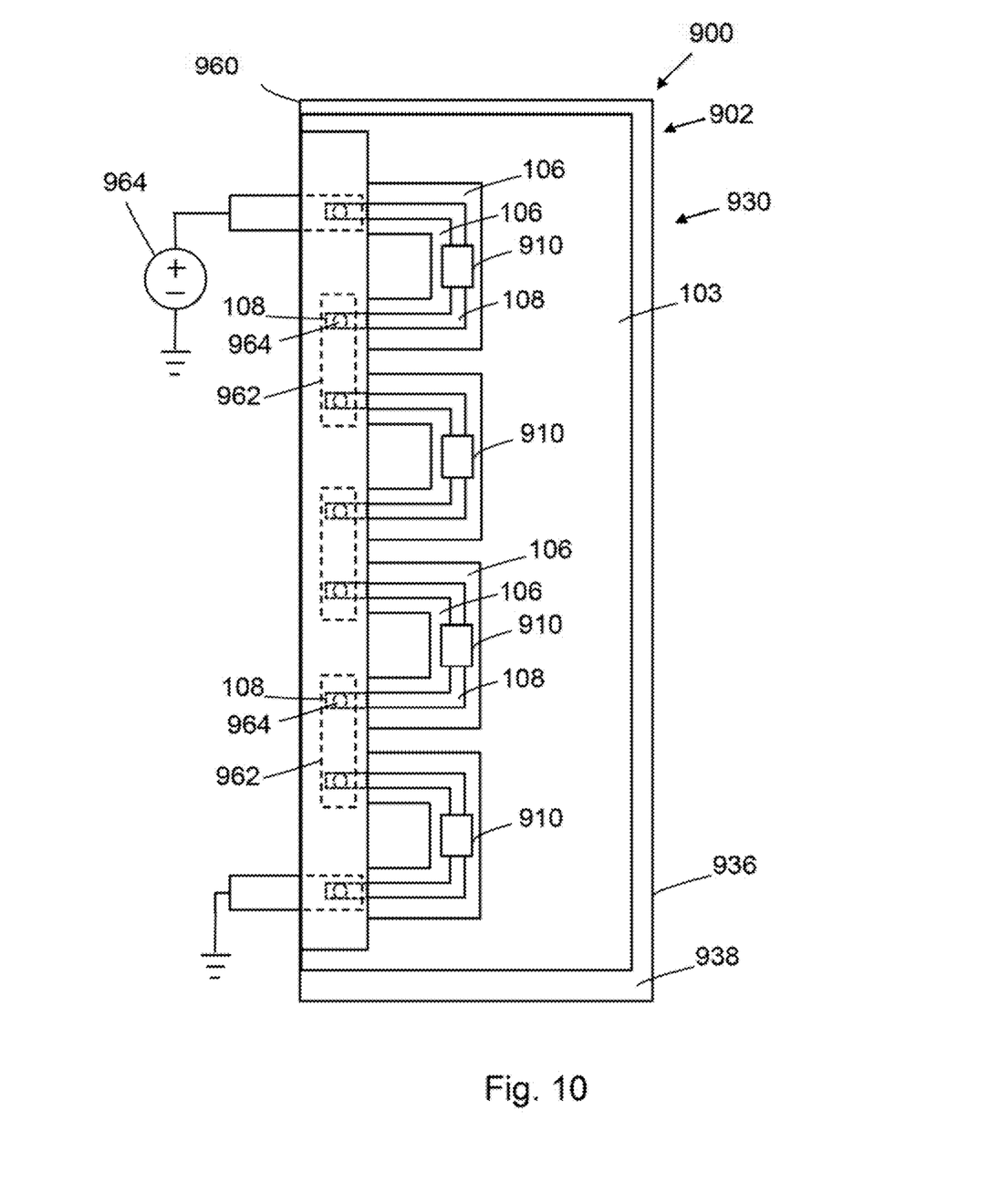
FIG. 10 is a plan view of the circuit board of FIG. 1 having to rigid frame and forming a light engine in a display device.

Referring now to FIGS. 9 and 10 an electronic circuit arrangement forming an LED light arrangement, also referred to as an LED light engine, for a display device 980 is shown generally at 900. The LED light engine 900 includes a flexible circuit board 902 similar to the flexible circuit board 102 described above. A plurality of light emitting electrical components 910 are bonded to the electrically conductive layer 108 disposed on the dielectric layer 106 in a similar manner as at least one of the electrical components 110, 310, 410, 510 described above.

The electrical components 910 are LEDs operatively coupled to an LCD display panel 982 of an image display device 980 as shown generally in FIG. 9. The LCD display panel 982 can be a back-lit LCD panel or a side-lit LCD panel. The example of FIGS. 9 and 10, includes a back-lit LCD display panel 982, wherein the LED light sources 910 are disposed so as to extend in a plurality of linear arrays or rows (only one of which is shown for clarity) so as to emit light towards the back side of the display panel, opposite the viewing, side. However, it should be appreciated that the LED light sources 910 can be disposed so as to extend in a linear array along the sides, top and bottom edges of an edge-lit LCD panel 982 so as to emit light towards the edges of the display panel.

A frame 930 is provided for supporting the flexible circuit board 902. The frame 930 is formed of a plastic, or other rigid material to support the flexible circuit board 902 at a desired orientation. The frame 930 includes a support member 936 having a support surface 938. In the example provided, the support surface 938 is generally planar. The flexible graphite substrate 903 is disposed against the support surface 938 such that the support member surface 938 supports the component section of the flexible circuit board in a generally planar configuration. The frame 930 can be mounted to the display device 980 such that the LED components 910 assume a vertical orientation in relation to the display while it is in use. In other examples, frame 930 can be mounted to the display device 980 such that the LED components 910 assume a horizontal orientation in relation to the display while it is in use.

The support member 936 can include an optional aperture 939 disposed in the support surface 938, such that the support surface supports the outer periphery of the flexible graphite substrate 103 and the aperture provides convective air cooling to a surface of the flexible graphite substrate.

The flexible circuit board 902 can be secured to the frame 930 using fasteners and/or adhesives. Alternatively or additionally, the flexible circuit board 902 can be secured to the frame 930 using one or more clamp members 960. In the examples provided in FIG. 9, one clamp member 960 is shown, though it should be appreciated that more than one can be used. The clamp member 960 can be a FR4 circuit board biasing the flexible circuit board 902 against the support surface 938. In at least one example the FR4 board is not electrically connected to the flexible circuit board 902. In another example, the FR4 circuit board includes an electrically conductive layer 962 providing an electrical connection between LEDs 910. In this example, the FR4 board includes electrically conductive pads 964 that mate with and are electrically connected to the electrically conductive layer 108. In this manner, a power supply 966 can provide power to FR4 board and power the LEDs during operation as shown.

Figure 11:
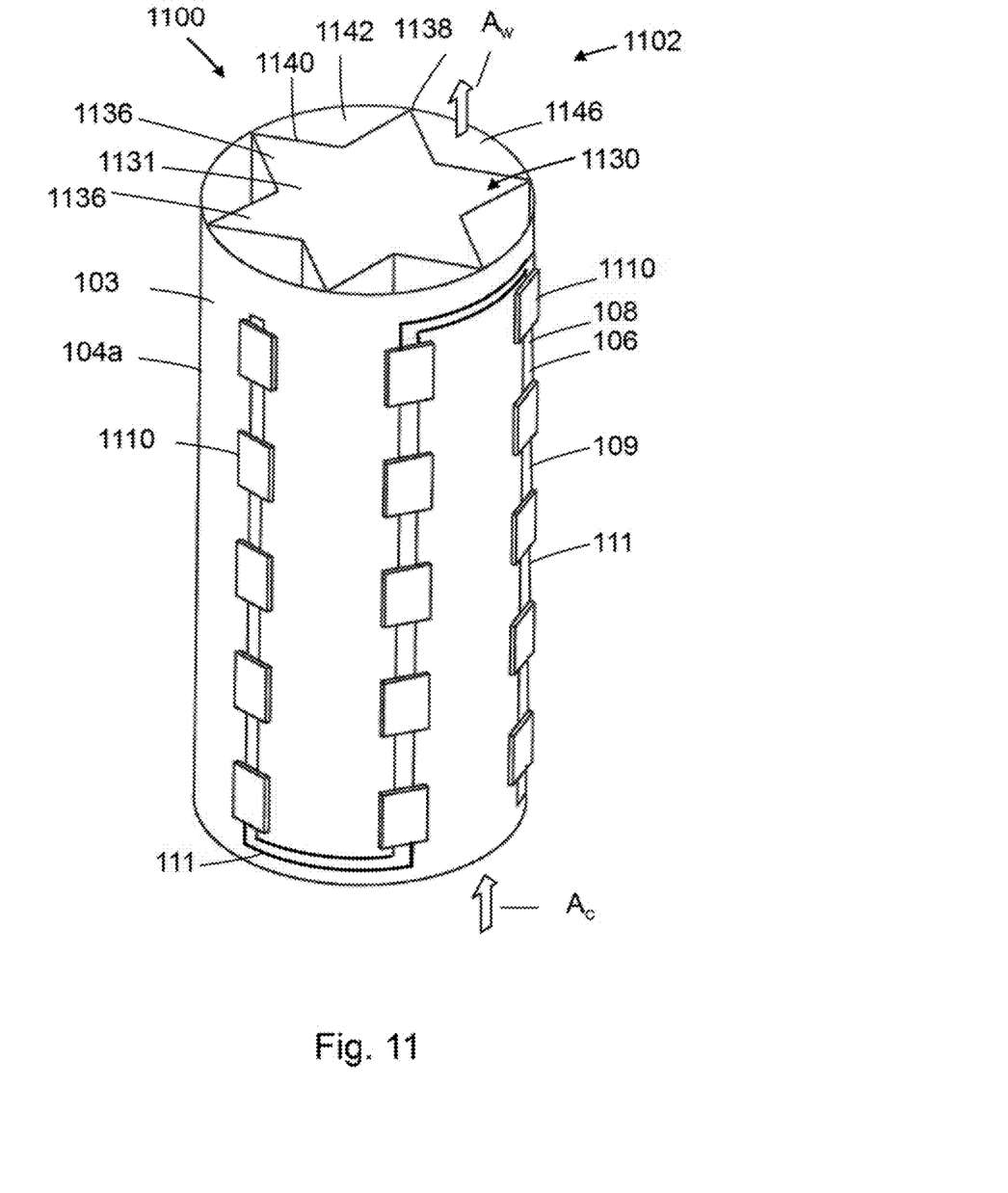
FIG. 11 is a perspective view of circuit board of FIG. 1 having a rigid frame and forming a light assembly for an LED light.

Referring now to FIG. 11, an electronic circuit arrangement forming an LED light arrangement is shown generally at 1100. The light arrangement 1100 includes a flexible circuit board 102 similar to the flexible circuit board 102 described above. A plurality of light emitting electrical components 1110 are bonded to the electrically conductive layer 108 disposed on the dielectric layer 106 in a similar manner as at least one of the electrical components 110, 310, 410, 510, 710, 910 described above. The plurality of light emitting electrical components 1110 can be LEDs.

The flexible graphite substrate 103 defines a cylinder such that the first major surface 104a is a radially outer surface of the cylinder and the dielectric layer 106 is disposed on the radially outer surface, wherein the plurality of LEDs 1110 are mounted at the radially outer surface so as to be in contact with the electrically conductive layer 108. The electrically conductive layer 108 can form a circuit trace 111 forming at least part of the electrical circuit 109 having a length L extending substantially longer than its width W, examples of which can include equal length L equal to about 4*W, L equal to about 8*W, and L greater than about 10*W. The circuit trace 111 can extend axially and/or circumferentially along the cylindrical surface 104a of the flexible graphite substrate 103 to form the circuit 109. In other examples, the circuit trace 111 can extend in other directions in addition to axially and/or circumferentially to form the circuit 109.

A rigid frame 1130 supports the flexible circuit board in this configuration. The rigid frame 1130 includes a central portion 1131 extending in a longitudinal direction along the axis of the cylinder. The frame 1130 includes a plurality of support members 1136 extending radially from central portion 1131, each terminating in a radially outwardly facing support surface 1138. The support surfaces 1138 are in supportive physical contact with the second major surface 104b of the flexible graphite substrate 103. The frame 1130 includes a plurality of channels 1140, each channel being disposed between pairs of adjacent support members 1136.

The cylindrically shaped flexible circuit board 1130 is disposed against the support surfaces 1138 such that the support surfaces support the flexible circuit board in a spaced apart relationship with the channels 1140 to form air ducts 1142 between the channel and the flexible circuit board. The air ducts 1142 include an inlet 1144 for receiving relatively cooler air $A_C$ and an outlet 1146 for exhausting relatively warmer air $A_W$ thereby directing air past the portion of the circuit board to which the LEDs 1110 are mounted to provide convective cooling of the circuit board 1102. The rigid frame 1130 can be mounted such that the air duct 1142 extends generally vertically from the inlet 1144 to the outlet 1146 to enhance the flow of convective air currents.

Figure 12:
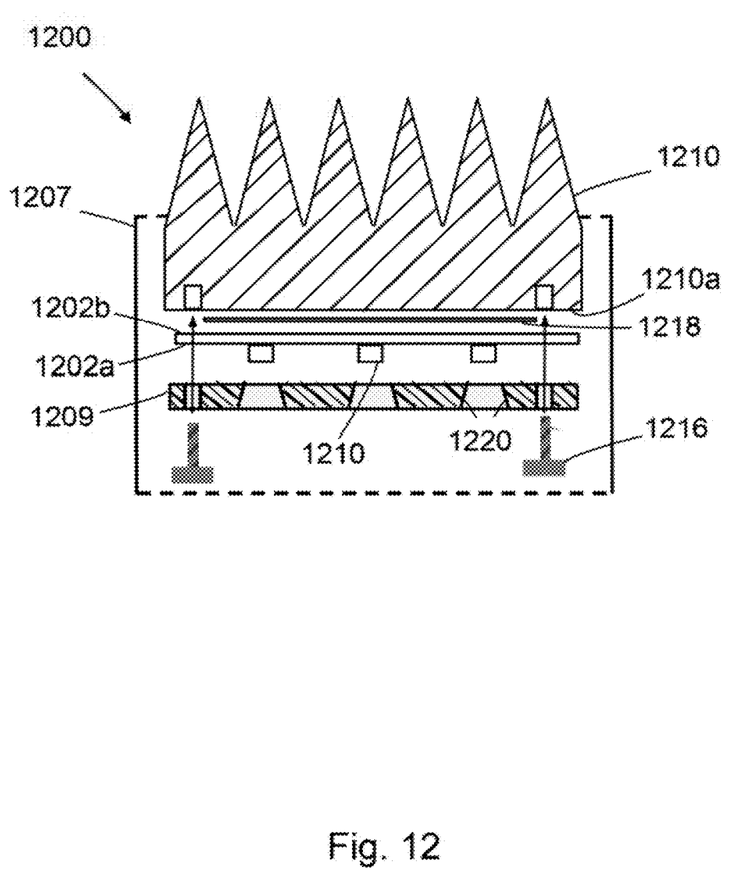
FIG. 12 is a sectional view of an electronic circuit arrangement forming an LED down light.

Referring now to FIG. 12, an further embodiment of an electronic circuit arrangement forming an LED downlight is shown generally at 1200. The down light 1200 includes a housing 1207 enclosing as flexible circuit board 1202 similar to the flexible circuit board 102 described above. A plurality of light emitting electrical components 1210 are bonded to the electrically conductive layer 108 disposed on the dielectric layer 106 arranged on a first major surface 1202a of the flexible surface 1202 in a similar manner as at least one of the electrical components 110, 310, 410, 510, 710, 910 described above. The plurality of light emitting electrical components 1210 can be LEDs.

The down light also includes a heat sink 1210 which can be formed of metal, such as aluminum or other metal material for dissipating the heat generated by light emitting electrical components 1210. The heat sink 1210 can extend outside of the housing 1207 or alternatively be formed of (i.e. integral to), at least in part, of the housing if so desired.

The downlight 1210 also includes a rigid structural 1209 plate. The structural plate 1209 can be formed of plastic, or other non-conductive materials having suitable rigidity for use as described herein.

The flexible circuit board 1202 includes a second major surface 1202b disposed opposite the first major surface 1202a disposed adjacent a surface 1210a of the heat sink 1210. The structural plate 1209 is pressed against the first major surface 1202a of the flexible circuit board 1202 and secured to the heat sink with a plurality of fasteners 1216. In one non-limiting example, the fasteners are screws/bolts which extend through the structural plate 1209 and the flexible circuit board. 1202 and into the heat sink 1210 to secure the structural plate to the heat sink. The flexible circuit board 1202 is clamped between the structural plate 1209 and the heat sink 1210 and pressed against the heat sink surface 1202a so as to be in effective conductive thermal communication with the heat sink. The rigid structural plate 1209 applies a clamping to press the flexible circuit board 1202 against the heat sink 1210 thereby reducing the bond line thermal resistance between the metal heat sink 1210 and graphite substrate 103 of the flexible circuit board. In this manner, the heat generated by the light emitting electrical components 2110 is transferred by the flexible graphite circuit board 1202 to the heat sink 1210 for effective conductive and convective dissipation.

This arrangement can eliminate the need for a thermal interface material between the circuit board 1202 and the heat sink 1210. Alternatively, an optional thermal interface material 1218 can be disposed between the second major surface 1202b and the heat sink surface 1210a to further improve heat transfer.

The structural plate 1209 can include reflector surfaces 1220 encircling the light emitting electrical components 1210 to enhance the illumination provided by the downlight 1200. In at least one example, the reflective surfaces 1220 can be tapered apertures extending through the structural plate 1209 and located in alignment with the positions of the light emitting electrical components 1210 so as to receive and encircle them when the circuit board is disposed between the heat sink and the structural plate. In this manner, the reflective surfaces 1220 can eliminate the need for a white reflective coating, such as a PET coating or the like, or a printed silkscreen on the circuit board.

All cited patents and publications referred to in this application are incorporated by reference in their entirety.

The invention thus being described, it will clear that it may be varied in many ways. Modifications and alterations will occur to others upon reading and understanding the preceding specification. It is intended that the invention be construed as including all such modifications and alterations insofar as they come within the scope of the appended claims or the equivalents thereof.

What is claimed is:

1. A light emitting diode (LED) light arrangement comprising:
   a flexible circuit board including a flexible graphite substrate having a first major surface and a second major surface, a dielectric layer disposed on at least one of the first and second major surfaces, and an electrically conductive layer arranged to form an electrical circuit disposed on the dielectric layer;
   an LED mounted to the flexible graphite substrate and in electrically conductive contact with the electrically conductive layer thereby forming a component of the electrical circuit; and
   a rigid frame having as support member with a support surface in physical contact with the flexible circuit board.

2. The LED light arrangement of claim 1 wherein the electrically conductive layer is in direct contact with the dielectric layer and the dielectric layer is in direct contact with the flexible graphite substrate.

3. The LED light arrangement of claim 1, wherein the graphite substrate is formed of exfoliated graphite.

4. The LED light arrangement of claim 1, wherein the graphite substrate is formed of a single sheet of compressed particles of exfoliated graphite.

5. The LED light arrangement of claim 4, wherein the graphite substrate is formed of a plurality of sheets of compressed particles of exfoliated graphite and the plurality of sheets are laminated together in direct contact with each other.

6. The LED light arrangement of claim 1, wherein the graphite substrate has an in-plane thermal conductivity of at least about 250 W/m*K.

7. The LED light arrangement of claim 1, wherein the graphite substrate synthetic graphite.

8. The LED light arrangement of claim 1, wherein the electrically conductive layer includes at least one of silver, copper, aluminum, and metal foil.

9. The LED light arrangement of claim 1, wherein the electrically conductive layer is a thick film paste.

10. The LED light arrangement of claim 1, wherein the dielectric layer is a thick film paste.

11. The LED light arrangement of claim 1, wherein the dielectric layer is polyimide.

12. The LED light arrangement of claim 1, wherein the flexible graphite substrate is formed of at least one flexible graphite sheet having a thickness of about 0.001 mm to about 1.0 mm.

13. The LED light arrangement of claim 1, wherein the flexible graphite substrate is formed of at least one flexible graphite sheet having a thickness of about 0.120 mm to about 0.250 mm.

14. The LED light arrangement of claim 1, wherein the flexible circuit board has a bend radius of less than 600 mm.

15. The LED light arrangement of claim 1, wherein the flexible circuit board has a bend radius of less than 75 mm.

16. The LED light arrangement of claim 1, wherein the flexible circuit board has a bend radius of less than 12 mm.

17. The LED light arrangement of claim 1 wherein the support member includes an aperture providing convective air cooling to a surface of the flexible graphite substrate.

18. The LED light arrangement of claim 1 wherein the support surface contacts the periphery of the flexible graphite substrate.

19. The LED light arrangement of claim 1 further comprising an FR4 circuit board having electrically conductive pads electrically connected to the electrically conductive layer.

20. The LED light arrangement of claim 19 wherein the FR4 circuit board biases the flexible circuit against the rigid frame.

21. The LED light arrangement of claim 1 further comprising
an FR4 circuit board which biases the flexible circuit against the rigid frame, wherein the FR4 circuit board is not electrically connected to the electrically conductive layer.

22. The LED light arrangement of claim 1 wherein the flexible graphite substrate defines a cylinder such that the first major surface is a radially outer surface of the cylinder and the dielectric layer is disposed on the radially outer surface, wherein the plurality of LEDs are mounted to the radially outer surface.

23. The LED light arrangement of claim 22 wherein the rigid frame includes a central portion extending in a longitudinal direction along the axis of the cylinder, the central portion includes plurality of radially extending support members, wherein each support member terminates in a radially outwardly facing support surface in supportive physical contact with the second major surface of the flexible graphite substrate.

24. The LED light arrangement of claim 23 wherein the frame includes a plurality of channels, each channel being disposed between pairs of adjacent support members and the cylindrically shaped flexible circuit board is disposed against the support surfaces such that the support surfaces support the flexible circuit board in a spaced apart relationship with the channels to form air ducts between the channel and the flexible circuit board.

* * * * *